US012615039B2

(12) United States Patent
Iwai et al.

(10) Patent No.: US 12,615,039 B2
(45) Date of Patent: Apr. 28, 2026

(54) SEQUENCE PATTERN GENERATION DEVICE AND TRANSMISSION START TIMING CONTROL METHOD THEREOF

(71) Applicant: ANRITSU CORPORATION, Kanagawa (JP)

(72) Inventors: Tatsuya Iwai, Kanagawa (JP); Hironori Yoshioka, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 42 days.

(21) Appl. No.: 18/975,478

(22) Filed: Dec. 10, 2024

(65) Prior Publication Data
US 2025/0247083 A1 Jul. 31, 2025

(30) Foreign Application Priority Data
Jan. 29, 2024 (JP) ................................ 2024-010963

(51) Int. Cl.
*H03K 5/131* (2014.01)
*H03K 5/00* (2006.01)

(52) U.S. Cl.
CPC ... *H03K 5/131* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 10,417,171 | B1 * | 9/2019 | Sarmah | G06F 1/3253 |
| 2005/0243163 | A1 * | 11/2005 | Ozasa | H04N 1/053 347/243 |
| 2006/0202875 | A1 * | 9/2006 | Fujisawa | G06F 1/025 341/100 |
| 2010/0090737 | A1 * | 4/2010 | Watanabe | H03L 7/0812 327/161 |

(Continued)

FOREIGN PATENT DOCUMENTS

JP 5432352 B1 3/2014

OTHER PUBLICATIONS

J. Ma, L. Zhang, Y. Hui, X. Li, J. Tan and F. Li, "Design and implementation of dynamic phase adjustment technology based on delayed phase-locked loop," 2022 14th International Conference on Measuring Technology and Mechatronics Automation (ICMTMA), Changsha, China, 2022, pp. 52-56, (Year: 2022).*

*Primary Examiner* — Daniel F. McMahon
(74) *Attorney, Agent, or Firm* — McDonald Hopkins LLC

(57) ABSTRACT

A sequence pattern generation device that can control skew between lanes of a plurality of lanes by controlling a transmission start timing of a sequence pattern of a plurality of outputs. The sequence pattern generation device includes a primary module 2 and a secondary module 3 each having two outputs of data signals, and a device control unit 16 that, in a case where a start of a sequence of the outputs of the data signals is synchronized, sets delay amounts, aligns phases of clocks of the primary module 2 and the secondary module 3, locks phases of clocks of a primary data generation unit 26 of the primary module 2 and a secondary data generation unit 36 of the secondary module 3, and starts the sequence with the delay amounts set in the primary data generation unit 26 and the secondary data generation unit 36.

4 Claims, 3 Drawing Sheets

(56) References Cited

U.S. PATENT DOCUMENTS

| 2011/0072296 | A1* | 3/2011 | Nakayama | G06F 13/4072 |
| | | | | 713/401 |
| 2011/0309871 | A1* | 12/2011 | Miyahara | G01S 19/14 |
| | | | | 327/299 |
| 2013/0089111 | A1* | 4/2013 | Ookubo | H04J 3/1652 |
| | | | | 370/512 |
| 2018/0241492 | A1* | 8/2018 | Konishi | H04L 25/4908 |
| 2022/0166598 | A1* | 5/2022 | Saeki | H04N 1/00005 |
| 2025/0062758 | A1* | 2/2025 | Mishra | H03K 5/249 |

* cited by examiner

SEQUENCE PATTERN GENERATION DEVICE AND TRANSMISSION START TIMING CONTROL METHOD THEREOF

TECHNICAL FIELD

The present invention relates to a sequence pattern generation device that generates and outputs various sequence patterns set by a user.

BACKGROUND ART

In recent years, various digital communication devices have been required to have a larger transmission capacity with the increase in the number of users and the spread of multimedia communication. As an index for quality evaluation of the digital signal in these digital communication devices, a bit error rate defined as a comparison between the number of occurrence of a code error in the received data and the total number of the received data is known.

In an error rate measurement device that measures the above-described bit error rate, a test signal including fixed data is transmitted to a device under test which is a test target, and an error rate of a measurement signal is measured by comparing the measurement signal input via the device under test with a reference signal that is a reference in units of bits.

In this type of error rate measurement device, a pulse pattern generation device has been used which generates a data signal of a predetermined pulse pattern to be input as a test signal to a device under test compatible with high-speed data communication in recent years.

Patent Document 1 discloses a pulse pattern generation device that sets a master side phase difference target value according to the frequency of a reference clock signal and sets a slave side phase difference target value using correction data of a storage unit in order to keep a phase state of a plurality of data signals constant.

RELATED ART DOCUMENT

Patent Document

[Patent Document 1] Japanese Patent No. 5432352

DISCLOSURE OF THE INVENTION

Problem that the Invention is to Solve

In a standard of a high speed serial bus (HSB) such as a Universal Serial Bus (USB) or a Peripheral Component Interconnect Express (PCIe), a state machine called a Link Training & Status State Machine (LTSSM) is provided, and thus initialization of communication between devices, adjustment of link speed, and the like are managed.

In addition, an error rate measurement device according to the related art has a function (sequence pattern function) of controlling PCIe GEN1 to GEN5 and USB 3.1 LTSSM by rapidly switching a specific pattern defined by a standard from a Pulse Pattern Generator (PPG) and transitioning to a specific state. A pattern for state transition of a Device Under Test (DUT) is defined by a standard, and the output order of the patterns can be combined and output by the sequence pattern function.

In the PCIe standard, the number of lanes is defined in variations such as x1, x2, x4, x8, and x16, and a pattern defined for each lane is transmitted to cause the DUT to perform a state transition. The number of lanes varies depending on the DUT.

In a case of one lane such as x1, it is not necessary to consider the operation of other lanes.

However, in order to simultaneously perform state transition of a DUT having a plurality of lanes, such as x2 or x4, an allowable skew, which is an allowable value of a time of phase deviation between lanes of a pattern to be input to the DUT, is defined. Therefore, it is necessary to transmit a sequence pattern of each lane to the DUT within a range of deviation according to the allowable skew.

In a case of evaluating the DUT having the plurality of lanes, the current sequence pattern transmitter cannot control the skew of each lane, and thus the sequence pattern cannot be transmitted within a skew range allowed by PCIe.

In addition, since the skew of each lane cannot be controlled, a skew resistance test for testing how much skew can be normally processed cannot be performed.

Therefore, an object of the present invention is to provide a sequence pattern generation device capable of controlling skew between lanes of a plurality of lanes by controlling a transmission start timing of a sequence pattern of a plurality of outputs.

Means for Solving the Problem

According to the present invention, there is provided a sequence pattern generation device (1), in which one or more modules (2, 3) each having one or more outputs of data signals are mountable and a total number of outputs of the data signals is equal to or greater than two, including a device control unit (16) that, in a case where a start of a sequence of the outputs of the data signals is synchronized, sets delay amounts in data generation units (26, 36) by control units (29, 39) of all the modules each having an output to be synchronized, aligns phases of clocks of all the modules each having the output to be synchronized, and starts the sequence with the set delay amount after phases of clocks of the data generation units of the modules are locked.

With this configuration, in a case where the start of the sequence of the outputs of the data signals is synchronized, the delay amounts are set in the data generation units by the control units of all the modules each having the output to be synchronized, the phases of the clocks of all the modules each having the output to be synchronized are aligned, the phases of the clocks of the data generation units of the modules are locked, and then the sequence is started with the set delay amount. Therefore, by controlling the transmission start timing of the sequence pattern of the plurality of outputs, the skew between the lanes of the plurality of lanes can be controlled.

In the sequence pattern generation device of the present invention, the control unit controls the delay amount by performing control of the phase of the clock of the data generation unit for a portion of the delay amount equal to or less than ±500 mUI (Unit Interval), and controls the delay amount by shifting an output bit in units of 1 UI to the data generation unit for a portion of the delay amount greater than ±500 mUI.

With this configuration, the delay amount is controlled by performing control of the phase of the clock of the data generation unit for a portion of the delay amount equal to or less than ±500 mUI, and the delay amount is controlled by shifting the output bit in units of 1 UI to the data generation unit for a portion of the delay amount greater than ±500 mUI. Therefore, the delay amount can be easily controlled.

In addition, according to the present invention, there is provided a transmission start timing control method of a sequence pattern generation device (1), in which one or more modules (2, 3) each having one or more outputs of data signals are mountable and a total number of outputs of the data signals is equal to or greater than two, the transmission start timing control method including in a case where a start of a sequence of the outputs of the data signals is synchronized, setting delay amounts in data generation units (26, 36) of all the modules each having an output to be synchronized; aligning phases of clocks of all the modules each having the output to be synchronized; and starting the sequence with the set delay amount after phases of clocks of the data generation units (26, 36) of the modules are locked.

With this configuration, in a case where the start of the sequence of the outputs of the data signals is synchronized, the delay amounts are set in the data generation units by the control units of all the modules each having the output to be synchronized, the phases of the clocks of all the modules each having the output to be synchronized are aligned, the phases of the clocks of the data generation units of the modules are locked, and then the sequence is started with the set delay amount. Therefore, by controlling the transmission start timing of the sequence pattern of the plurality of outputs, the skew between the lanes of the plurality of lanes can be controlled.

In the transmission start timing control method of the sequence pattern generation device of the present invention, the delay amount is controlled by performing control of the phase of the clock of the data generation unit for a portion of the delay amount equal to or less than ±500 mUI (Unit Interval), and the delay amount is controlled by shifting an output bit in units of 1 UI to the data generation unit for a portion of the delay amount greater than ±500 mUI.

Advantage of the Invention

According to the present invention, it is possible to provide a sequence pattern generation device that can control skew between lanes of a plurality of lanes by controlling the transmission start timing of the sequence pattern of the plurality of outputs.

BEST MODE FOR CARRYING OUT THE INVENTION

Hereinafter, a sequence pattern generation device according to an embodiment of the present invention will be described in detail with reference to the drawings.

Figure 1:
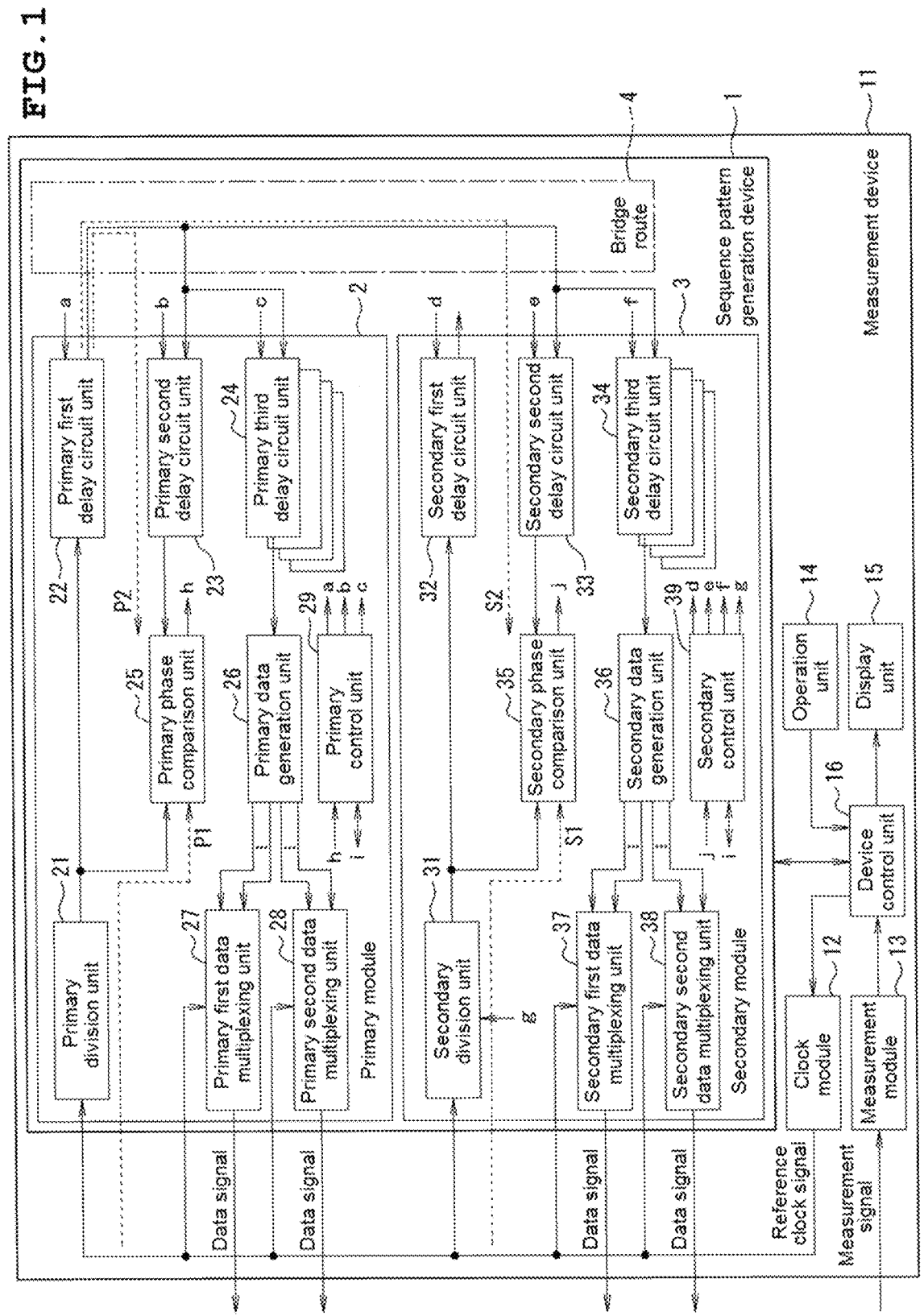
FIG. 1 is a block diagram of a sequence pattern generation device according to an embodiment of the present invention.

In FIG. 1, a sequence pattern generation device 1 according to an embodiment of the present invention is configured to include a primary module 2 and a secondary module 3, each of which can output two data signals. The primary module 2 and the secondary module 3 are connected by wiring through a bridge route 4. The primary module 2 and the secondary module 3 may output one data signal or may output two or more data signals.

The primary module 2 and the secondary module 3 are attachably and detachably provided in a slot (not shown) of the device main body of a measurement device 11. As shown in FIG. 1, a plurality of modules such as a clock module 12 and a measurement module 13 are attachably and detachably provided in slot a (not shown) of the measurement device 11, in addition to the primary module 2 and the secondary module 3.

As shown in FIG. 1, the measurement device 11 includes an operation unit 14, a display unit 15, and a device control unit 16, in which a plurality of modules (the primary module 2, the secondary module 3, the clock module 12, the measurement module 13, and the like) selected according to measurement content can be freely added, removed, and recombined to slots (not shown), and various measurements of the device under test based on the standard can be performed in various forms.

The clock module 12 is configured of a clock generator, and generates a reference clock signal (½ half-rate clock or full-rate clock) to be input to the primary module 2 and the secondary module 3.

The clock module 12 is not limited to a configuration in which the clock module 12 is attachable and detachable to a slot (not illustrated) of the measurement device 11, and an external clock generator separate from the measurement device 11 can also be used.

The measurement module 13 performs various measurements on the device under test based on a set value of the measurement parameter set by the operation of the operation unit 14.

The operation unit 14 includes, for example, a pointing device such as a mouse or a touch screen for operating a pointer or an icon on the display screen of the display unit 15, and keys, switches, buttons, or the like provided in the device main body of the measurement device 11. The operation unit 14 performs various operations related to various types of measurement, such as an instruction to start or stop measurement, designation of a measurement channel for setting a measurement parameter, and setting/changing/reference of a measurement parameter on a setting screen, in addition to initial setting of an initial value (minimum value or maximum value) of a bit rate that can be generated by the sequence pattern generation device 1, an initial division ratio of a primary division unit 21 and a secondary division unit 31, which will be described later, of the primary module 2 and the secondary module 3, an initial delay amount of each of delay circuit units 22, 23, and 24 of the primary module 2 and each of delay circuit units 32, 33, and 34 of the secondary module 3, and an allowable range of a phase difference target value of the primary phase comparison unit 25 and the secondary phase comparison unit 35.

The display unit 15 is configured by, for example, a liquid crystal display or the like provided in the device main body of the measurement device 11, displays a setting screen for performing initial setting on the operation unit 14, displays a screen of a predetermined measurement channel, and displays a measurement screen or the like on a display screen.

The device control unit 16 is configured by, for example, a microcomputer including a Central Processing Unit (CPU), a Read Only Memory (ROM), a Random Access Memory (RAM), and the like, and integrally controls the primary module 2, the secondary module 3, the clock module 12, the measurement module 13, the operation unit 14, and the display unit 15 while including setting control of each module based on the operation of the operation unit 14, variable control of the bit rate, output control of the reference clock signal, various measurement control of the device under test based on the measurement signal, display control of the setting screen or the measurement screen, and the like.

Next, the configurations of the primary module 2 and the secondary module 3 constituting the sequence pattern generation device 1 will be described.

As shown in FIG. 1, the primary module 2 includes a primary division unit 21, a primary first delay circuit unit 22, a primary second delay circuit unit 23, a primary third delay circuit unit 24, a primary phase comparison unit 25, a primary data generation unit 26, a primary first data multiplexing unit 27, a primary second data multiplexing unit 28, and a primary control unit 29.

The primary division unit 21 is configured by a 1/N division unit (N: positive integer equal to or greater than 2), divides a reference clock signal generated by the clock module 12 or an external clock source by 1/N, and inputs division clock signals obtained through the 1/N division to the primary first delay circuit unit 22 and the primary phase comparison unit 25.

The reference clock signal is a half-rate clock or a full-rate clock at a frequency at which the sequence pattern generation device 1 can be operated (for example, 1.25 GHz to 16 GHZ), and is generated by, for example, a clock source prepared by a user, an internal synthesizer incorporated in the measurement device 11 together with the sequence pattern generation device 1, or an external synthesizer separate from the measurement device 11. In addition, the reference clock signals having the same phase are input to the primary module 2 and the secondary module 3.

The primary first delay circuit unit 22 is configured by, for example, an IQ modulator, and adjusts a delay amount by changing a phase angle of a division clock signal from the primary division unit 21 under the control of the primary control unit 29 such that a data signal (parallel data) and a reference clock signal input from the primary data generation unit 26 to the primary first data multiplexing unit 27 and the primary second data multiplexing unit 28 have an optimal phase relationship. The division clock signal in which the delay amount is adjusted is input to the primary phase comparison unit 25 via the primary second delay circuit unit 23, and is also input to the secondary second delay circuit unit 33 and the secondary third delay circuit unit 34 of the secondary module 3 via a bridge route 4.

The primary second delay circuit unit 23 is configured by, for example, an electronic delay in which delay elements (gate delays) that perform switching in units of several picoseconds in an electrical manner are multi-stage-connected to adjust the delay amount of the division clock signal. The primary second delay circuit unit 23 functions as a bypass circuit that allows the division clock signal of which the delay amount is adjusted by the primary first delay circuit unit 22 to pass through as it is and inputs the division clock signal to the primary phase comparison unit 25.

The primary third delay circuit unit 24 is configured by the same electronic delay as the primary second delay circuit unit 23, and includes the same number of electronic delays as the number of transmission lanes of the parallel data generated by the primary data generation unit 26. For example, in a case where the number of transmission lanes of the parallel data is 8, the primary third delay circuit unit 24 is configured by 8 electronic delays. The primary third delay circuit unit 24 appropriately adjusts a delay amount for each piece of data under the control of the primary control unit 29 in order to perform skew adjustment of each piece of parallel data input from the primary data generation unit 26 to the primary first data multiplexing unit 27 and the primary second data multiplexing unit 28.

The primary phase comparison unit 25 performs phase comparison on the division clock signals P1 input from the primary division unit 21 with the division clock signal P2 input from the primary second delay circuit unit 23 via the bridge route 4 after passing through the primary first delay circuit unit 22 from the primary division unit 21 while regarding as clock and data to be input to the primary first data multiplexing unit 27 and the primary second data multiplexing unit 28, and outputs a phase difference signal (voltage signal) P2–P1 corresponding to the phase difference to the primary control unit 29.

The primary data generation unit 26 is provided on one Field Programmable Gate Array (FPGA) capable of partial configuration, and generates parallel data (for example, 4 Gbps×8 pieces) of a predetermined number of transmission lanes at the timing of the division clock signal from the primary third delay circuit unit 24 as a data signal having various pulse patterns set by the user, and outputs the parallel data to the primary first data multiplexing unit 27 and the primary second data multiplexing unit 28.

The primary first data multiplexing unit 27 and the primary second data multiplexing unit 28 are configured by, for example, a multiplexer (MUX), a D-type flip-flop circuit, or the like, and multiplex the parallel data input from the primary data generation unit 26 into serial data at the timing of the reference clock signal and output the multiplexed serial data.

The primary control unit 29 controls the primary division unit 21, each of the delay circuit units 22, 23, and 24 of the primary module 2, the primary phase comparison unit 25, the primary data generation unit 26, the primary first data multiplexing unit 27, and the primary second data multiplexing unit 28 in an integrated manner to synchronize and output the phases of a plurality of data signals with various pulse patterns set by the user.

The primary control unit 29 stores a primary-side phase difference target value targeted by the primary phase comparison unit 25 of the primary module 2 as correction data which is obtained in association with each predetermined step of the frequency (bit rate) of the reference clock signal as a table.

The primary control unit 29 sets the primary-side phase difference target value targeted by the primary phase comparison unit 25 of the primary module 2 in accordance with the frequency (bit rate) of the reference clock signal.

The primary-side phase difference target value corresponds to one-to-one for each frequency (bit rate) of the reference clock signal. For example, in a case where the reference clock signal is a half-rate clock, the fixed allowable range consists of an allowable maximum value and an allowable minimum value that are values deviated from a center voltage value by ±1 cycle (for example, in a case of 32 Gbit/s, ±31.25 psec: corresponding to a cycle in which the primary division unit 21 changes a direction). In addition, in a case where the reference clock signal is a full-rate clock, the fixed allowable range consists of an allowable maximum value and an allowable minimum value that are values deviated from the center voltage value by ±0.5 cycles.

In addition, in a case of setting the primary-side phase difference target value at the frequency (bit rate) of the reference clock signal that is not stored in the primary control unit 29, calculation is performed by linear interpolation from the correction data of two points at the frequencies (bit rates) of the reference clock signals before and after the frequency (bit rate) of the reference clock signal.

The primary control unit 29 performs adjustment control on the delay amount of each of the delay circuit units 22, 23, and 24 of the primary module 2. Specifically, in a case where the initial setting is performed by the operation unit 14, the primary control unit 29 performs adjustment control on the delay amount of each of the delay circuit units 22, 23, and 24 of the primary module 2 to the initial delay amount.

In addition, in a case of outputting the four data signal pattern generation timings while keeping the timings constant, the primary control unit 29 performs adjustment control on the delay amount of the primary second delay circuit unit 23 such that a voltage read-out value (voltage value corresponding to the phase difference signal P2–P1) of the primary phase comparison unit 25 is substantially equal to the center voltage value.

Similarly to the primary module 2, the secondary module 3 is configured by a secondary division unit 31, a secondary first delay circuit unit 32, a secondary second delay circuit unit 33, a secondary third delay circuit unit 34, a secondary phase comparison unit 35, a secondary data generation unit 36, a secondary first data multiplexing unit 37, a secondary second data multiplexing unit 38, and a secondary control unit 39.

As in the primary division unit 21 of the primary module 2, the secondary division unit 31 is configured by an 1/N division unit (N: positive integer equal to or greater than 2), divides a reference clock signal having the same phase as the reference clock signal input to the primary division unit 21 of the primary module 2 by 1/N, and inputs the division clock signal obtained through the 1/N division to the secondary first delay circuit unit 32 and the secondary phase comparison unit 35.

The secondary first delay circuit unit 32 is configured by an IQ modulator, similarly to the primary first delay circuit unit 22 of the primary module 2. The secondary first delay circuit unit 32 is a configuration that is not necessary in principle, but is provided in order to achieve commonality between the primary module 2 and the secondary module 3. The output of the secondary first delay circuit unit 32 is released so that the division clock signal is not output to any unit even in a case where the division clock signal is input from the secondary division unit 31.

Similarly to the primary second delay circuit unit 23 of the primary module 2, the secondary second delay circuit unit 33 is configured by, for example, an electronic delay in which delay elements (gate delays) that perform switching in units of several picoseconds in an electrical manner are multi-stage-connected to adjust the delay amount of the division clock signal. The secondary second delay circuit unit 33 adjusts the delay amount of the division clock signal received from the primary module 2 under the control of the secondary control unit 39 such that the phase relationship between the data signal (parallel data) and the reference clock signal input from the secondary data generation unit 36 to the secondary first data multiplexing unit 37 and the secondary second data multiplexing unit 38 is the same as the phase relationship between the data signal (parallel data) and the reference clock signal input to the primary first data multiplexing unit 27 and the primary second data multiplexing unit 28 of the primary module 2.

As in the primary third delay circuit unit 24 of the primary module 2, the secondary third delay circuit unit 34 is configured by an electronic delay and includes the same number of electronic delays as the number of transmission lanes of the parallel data generated by the secondary data generation unit 36. The secondary third delay circuit unit 34 appropriately adjusts a delay amount for each piece of data under the control of the secondary control unit 39 in order to perform skew adjustment of each piece of parallel data input from the secondary data secondary first data generation unit 36 to the multiplexing unit 37 and the secondary second data multiplexing unit 38.

The secondary phase comparison unit 35 performs phase comparison on the division clock signal S1 from the secondary division unit 31 with the division clock signal S2 input from the secondary second delay circuit unit 33 via the bridge route 4 after passing through the primary first delay circuit unit 22 of the primary module 2, and outputs a phase difference signal (voltage signal) corresponding to the phase difference S2–S1 to the secondary control unit 39.

As in the primary data generation unit 26 of the primary module 2, the secondary data generation unit 36 is provided on one FPGA capable of partial configuration, and generates parallel data (for example, 4 Gbps×8 pieces) of a predetermined number of transmission lanes at a timing of the division clock signal from the secondary third delay circuit unit 34 as a data signal having various pulse patterns set by the user, and outputs the parallel data to the secondary first data multiplexing unit 37 and the secondary second data multiplexing unit 38.

As in the primary first data multiplexing unit 27 and the primary second data multiplexing unit 28 of the primary module 2, the secondary first data multiplexing unit 37 and the secondary second data multiplexing unit 38 are configured by, for example, a multiplexer (MUX), a D-type flip-flop circuit, or the like, and multiplex the parallel data input from the secondary data generation unit 36 into serial data at the timing of the reference clock signal and output the multiplexed serial data.

The secondary control unit 39 controls the secondary division unit 31, each of the delay circuit units 32, 33, and 34 of the secondary module 3, the secondary phase comparison unit 35, the secondary data generation unit 36, the secondary first data multiplexing unit 37, and the secondary second data multiplexing unit 38 in an integrated manner to synchronize and output the phases of a plurality of data signals with various pulse patterns set by the user.

The secondary control unit 39 stores a secondary-side phase difference target value targeted by the secondary phase comparison unit 35 of the secondary module 3 and a correction value for absorbing the error in the delay amount generated by the variations in the characteristics or wiring of each of the delay circuit units 22, 23, and 24 of the primary module 2 and each of the delay circuit units 32, 33, and 34 of the secondary module 3 and phase deviation due to deterioration of the duty ratio of the primary division unit 21 and the secondary division unit 31 as correction data which is obtained in association with each predetermined step of the frequency (bit rate) of the reference clock signal as a table.

The correction value is a value obtained by subtracting the primary-side phase difference target value (voltage read-out value) from the secondary-side phase difference target value (voltage read-out value).

The secondary control unit 39 sets the secondary-side phase difference target value targeted by the secondary phase comparison unit 35 of the secondary module 3 in accordance with the frequency (bit rate) of the reference clock signal.

The secondary-side phase difference target value corresponds to one-to-one for each frequency (bit rate) of the reference clock signal. For example, in a case where the reference clock signal is a half-rate clock, the fixed allowable range consists of an allowable maximum value and an allowable minimum value that are values deviated from a center voltage value by ±1 cycle (for example, in a case of 32 Gbit/s, ±31.25 psec: corresponding to a cycle in which the secondary division unit 31 changes a direction). In addition, in a case where the reference clock signal is a full-rate clock, the fixed allowable range consists of an allowable maximum value and an allowable minimum value that are values deviated from the center voltage value by ±0.5 cycles.

In addition, in a case of setting the secondary-side phase difference target value at the frequency (bit rate) of the reference clock signal that is not stored in the secondary control unit 39, calculation is performed by linear interpolation from the correction data of two points at the frequencies (bit rates) of the reference clock signals before and after the frequency (bit rate) of the reference clock signal.

It is also possible to store correction data in advance in which values obtained by adding correction values to the center voltage value, the maximum value, and the minimum value of the primary-side phase difference target value at each predetermined step of the frequency (bit rate) of the reference clock signal are set as the center voltage value, the maximum value, and the minimum value of the secondary-side phase difference target value.

The secondary control unit 39 performs adjustment control on the delay amount of each of the delay circuit units 32, 33, and 34 of the secondary module 3. Specifically, in a case where the initial setting is performed by the operation unit 14, the secondary control unit 39 performs adjustment control on the delay amount of each of the delay circuit units 32, 33, and 34 of the secondary module 3 to the initial delay amount.

In addition, in a case of outputting the four data signal pattern generation timings while keeping the timings constant, the secondary control unit 39 performs adjustment control on the delay amount of the secondary second delay circuit unit 33 such that the voltage read-out value (voltage value corresponding to the phase difference S2–S1) of the secondary phase comparison unit 35 is substantially equal to the center voltage value.

Further, in a case where it is determined that a voltage read-out value (voltage value corresponding to the phase difference signal P2–P1) of the primary phase comparison unit 25 of the primary module 2 is not equal to a voltage read-out value (voltage value corresponding to the phase difference signal S2–S1) of the secondary phase comparison unit 35 of the secondary module 3, the secondary control unit 39 performs adjustment control on the delay amount of the secondary second delay circuit unit 33 such that the phase advances or delays by the inverse of the reference clock signal according to the change state of the voltage read-out value of the secondary phase comparison unit 35 of the secondary module 3.

For example, in a case where the reference clock signal is a half-rate clock and a change state of the voltage read-out value of the secondary phase comparison unit 35 increases on the right shoulder, adjustment control on the delay amount of the secondary second delay circuit unit 33 is performed such that the phase advances by 2 UI. On the other hand, in a case where the change state of the voltage read-out value of the secondary phase comparison unit 35 decreases on the right shoulder, adjustment control on the delay amount of the secondary second delay circuit unit 33 is performed such that the phase is delayed by 2 UI.

In a case where of outputting the four data signal pattern generation timings while keeping timings constant after the initial setting and the bit rate is variable by a predetermined amount, the secondary control unit 39 performs inhibition control on the secondary division unit 31.

In a case where the secondary control unit 39 performs inhibition control on the secondary division unit 31 by changing the bit rate from an initial value (minimum value or maximum value of the bit rate range) by a predetermined amount, a voltage read-out value (voltage value corresponding to the phase difference signal P2–P1) of the primary phase comparison unit 25 of the primary module 2 is compared with a voltage read-out value (voltage value corresponding to the phase difference signal S2–S1) of the secondary phase comparison unit 35 of the secondary module 3, and it is determined whether or not both the voltage read-out values are equal to each other (whether or not P2–P1=S2–S1).

By the way, in the configuration of FIG. 1 described above, in order to achieve the commonality of the primary module 2 and the secondary module 3, the internal configurations of both modules 2 and 3 are the same, but a configuration in which the secondary first delay circuit unit 32 of the secondary module 3 is omitted may be provided.

In the sequence pattern generation device 1 according to the present embodiment, each of the primary module 2 and the secondary module 3 has two outputs (referred to as Data1 and Data2), and can output up to four data signals. In a case where the module is added, the number of outputs can be increased without being limited to the above number.

In a case where the sequence pattern generation device 1 according to the present embodiment synchronously outputs the plurality of the outputs of the data signals, the transmission start timing of each of the plurality of the outputs of the data signals can be controlled.

Figure 2:
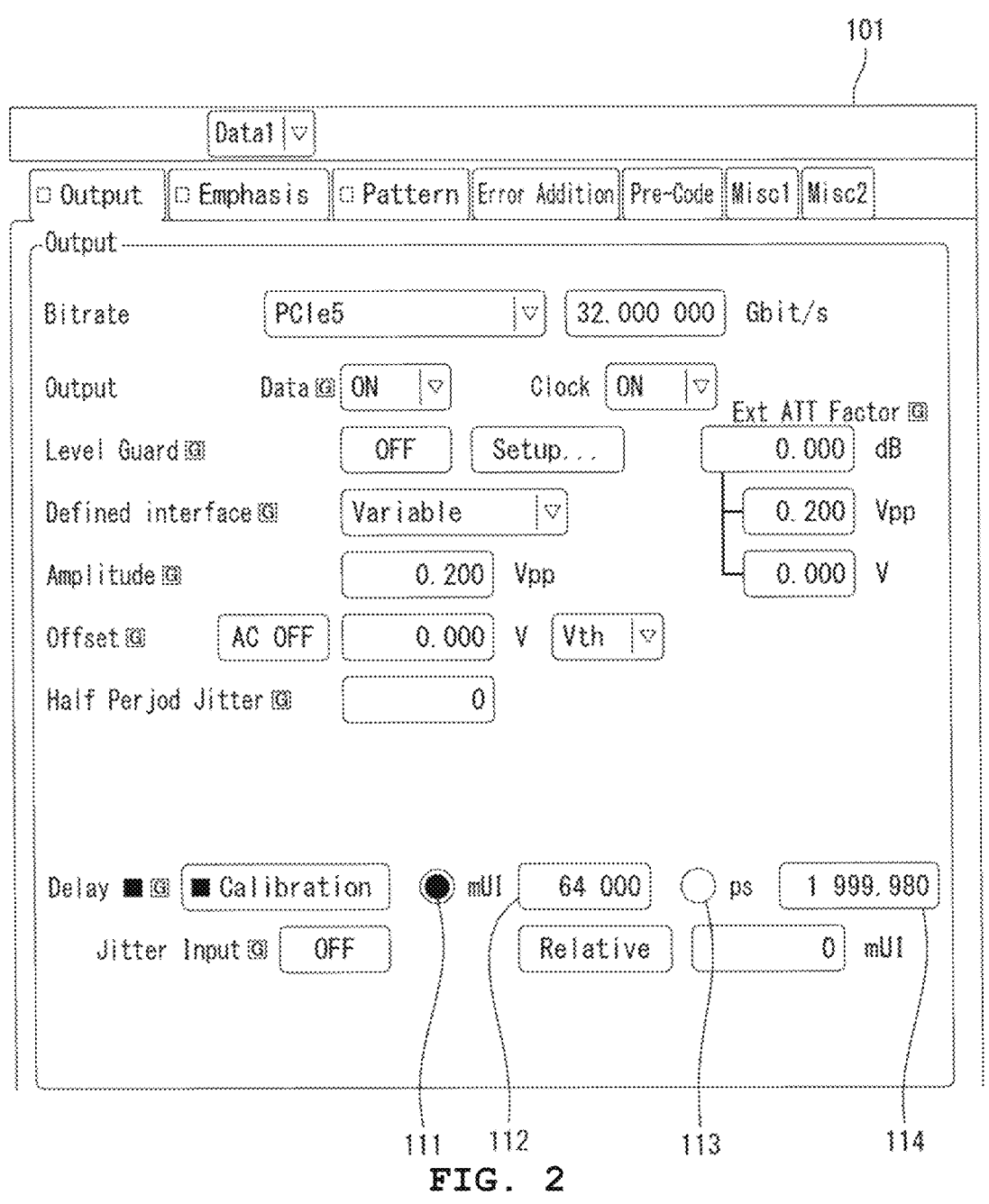
FIG. 2 is a diagram showing an example of an output setting screen of the sequence pattern generation device according to the embodiment of the present invention.

The device control unit 16 sets a start timing for the outputs of the data signals by, for example, an output setting screen 101 shown in FIG. 2.

In FIG. 2, an UI unit delay amount designation radio button 111 is selected to set the change amount (hereinafter, also referred to as a "delay amount") of the transmission start timing in units of UI.

An UI unit delay amount setting unit 112 sets the delay amount in units of UI. In a case where zero is set in the UI unit delay amount setting unit 112, the transmission start timing is not changed, and in a case where a value other than zero is set, a delay amount corresponding to the value is added. The UI unit delay amount setting unit 112 sets, for example, the delay amount in units of mUI. The UI unit delay amount setting unit 112 can set, for example, a delay amount of ±128 UI in units of 2 mUI.

A second unit delay amount designation radio button 113 is selected to set the delay amount in units of second.

A second unit delay amount setting unit 114 sets the delay amount in units of seconds. In a case where the zero is set in the second unit delay amount setting unit 114, the transmission start timing is not changed, and in a case where a value other than zero is set, a delay amount corresponding to the value is added. The second unit delay amount setting unit 114 sets, for example, the delay amount in units of picosecond.

In a case where one of the UI unit delay amount designation radio button 111 and the second unit delay amount designation radio button 113 is turned on, the other is turned off.

In a case where the delay amount is a positive number, the transmission start timing is delayed from the reference time for synchronization. In a case of a negative number, the transmission start timing is earlier than the reference time for synchronization.

The control units 29 and 39 control the delay amount by performing control of the phase of the clock input to the data generation units 26 and 36 for a portion of the delay amount equal to or less than ±500 mUI.

The control units 29 and 39 control the delay amount by shifting the output bit in 1 UI unit to the data generation units 26 and 36 for a portion of the delay amount greater than ±500 mUI.

For example, in a case where a delay amount of 2.3 UI is generated, the control units 29 and 39 generate a delay of 0.3 UI by the control of the phase of the clock in addition to the bit shift of 2 UI in the data generation units 26 and 36.

The operation is different between a case where two outputs in the modules 2 and 3 are synchronized and a case where outputs across the modules 2 and 3 are synchronized. The setting of the output to be synchronized and the setting of the delay amount are input by the operation performed on the operation unit 14 and are stored in the device control unit 16.

In a case where two outputs in the modules 2 and 3 are synchronized and the transmission start is selected for any one output by the input to the operation unit 14, the device control unit 16 notifies the control units 29 and 39 of the modules 2 and 3 of the set delay amount, and causes the data generation units 26 and 36 to set the delay amount.

The control units 29 and 39 control the clocks or the bit shifts of the data generation units 26 and 36 according to the set delay amount.

The device control unit 16 transmits a reset request of the sequence internal circuit to the control units 29 and 39 of the modules 2 and 3.

In a case where the reset request of the sequence internal circuit is received, the control units 29 and 39 reset the data generation units 26 and 36. In a case where the reset of the data generation units 26 and 36 is completed, the control units 29 and 39 transmit the completion of the reset to the device control unit 16. In a case where the reset is completed, the data generation units 26 and 36 are in a reset state.

In a case where the control units 29 and 39 receive the completion of the reset, the device control unit 16 transmits a reset release to the control units 29 and 39.

In a case where the control units 29 and 39 receive the reset release, the control units 29 and 39 release the reset states of the data generation units 26 and 36. In a case where the reset state is released, the data generation units 26 and 36 start generating the data of the sequence with a set delay amount and output the generated data to the first data multiplexing units 27 and 37 and the second data multiplexing units 28 and 38.

In this way, in a case where the two outputs in the modules 2 and 3 are synchronized, the synchronization of the clocks in the modules 2 and 3 is established. Therefore, in a case where the reset is released after the reset of the data generation units 26 and 36 is performed, the delay amount is added, the sequence is started, and thus the transmission start timing of the sequence can be controlled.

In a case where the outputs across the modules 2 and 3 are synchronized and the transmission start is selected for any one output of the outputs to be synchronized by the input to the operation unit 14, the device control unit 16 notifies the control units 29 and 39 of the modules 2 and 3 of the delay amount set in the control units 29 and 39, and causes the data generation units 26 and 36 to set the delay amount.

The control units 29 and 39 control the clocks or the bit shifts of the data generation units 26 and 36 according to the set delay amount.

The device control unit 16 sets all outputs which are targets of transmission start to a state in which transmission start is selected.

The device control unit 16 causes the control units 29 and 39 to perform the control of the phase of the clock such that the clocks of all the modules having the outputs to be synchronized are matched.

In a case where the control of the phase of the clock is completed, the device control unit 16 waits for the locking of the phases of the clocks of the data generation units 26 and 36 of all the modules having the outputs to be synchronized.

The data generation units 26 and 36 are configured by an FPGA, and a clock is input to a transceiver of the FPGA. The transceiver of the FPGA performs internal frequency division and frequency multiplication of a clock, and a phase locked loop (PLL) is used here. In a case where the frequency or phase of the clock to be input changes significantly, the PLL is unlocked.

Therefore, the device control unit 16 waits until the phase is locked from a state where the phase locking of the data generation units 26 and 36 is released. Before the phase locking, the clock output from the PLL is unstable, and a stable clock is obtained after the phase locking.

In a case where the phases of the clocks of the data generation units 26 and 36 of all the modules having the outputs to be synchronized are locked, the device control unit 16 transmits a reset request of the sequence internal circuit to the control units 29 and 39 of all the modules having the outputs to be synchronized.

In a case where the reset request of the sequence internal circuit is received, the control units 29 and 39 reset the data generation units 26 and 36. In a case where the reset of the data generation units 26 and 36 is completed, the control units 29 and 39 transmit the completion of the reset to the device control unit 16. In a case where the reset is completed, the data generation units 26 and 36 are in a reset state.

In a case where the control units 29 and 39 receive the completion of the reset, the device control unit 16 transmits a reset release to the control units 29 and 39.

In a case where the control units 29 and 39 receive the reset release, the control units 29 and 39 release the reset states of the data generation units 26 and 36. In a case where the reset state is released, the data generation units 26 and 36 start generating the data of the sequence with a set delay amount and output the generated data to the first data multiplexing units 27 and 37 and the second data multiplexing units 28 and 38.

In this way, in a case where the outputs across the modules 2 and 3 are synchronized, the phases of the clocks of all the modules having the outputs to be synchronized are aligned, the phases of the clocks of the data generation units 26 and 36 are locked, and then the sequence is started. Therefore, the delay amount is added, the sequence is started, and the transmission start timing of the sequence can be controlled.

Figure 3:
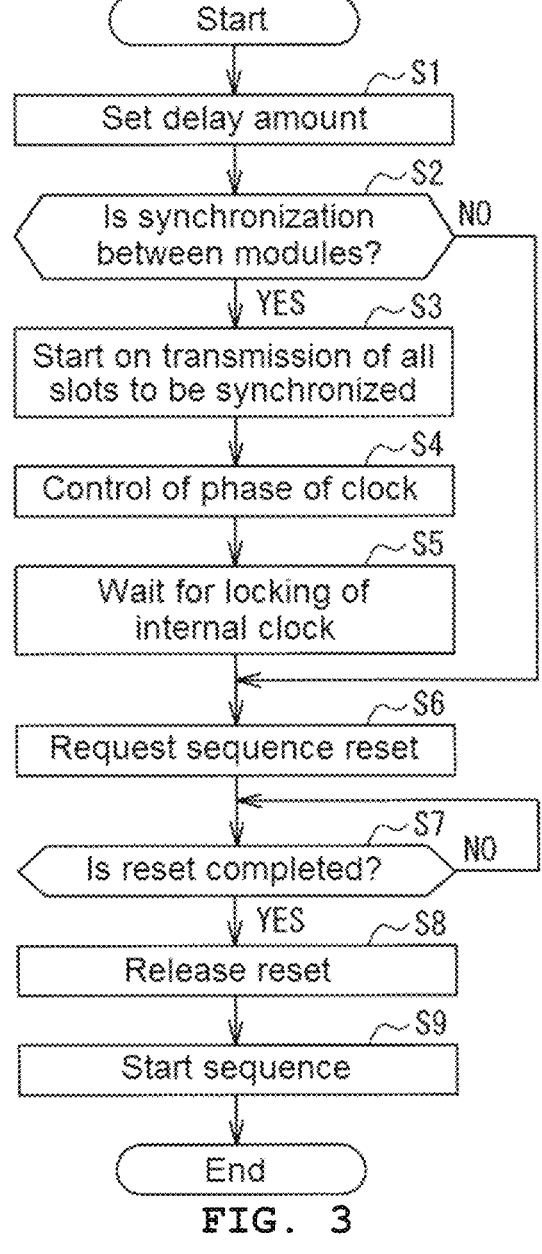
FIG. 3 is a flowchart illustrating a procedure of a sequence start process of the sequence pattern generation device according to the embodiment of the present invention.

A sequence start process by the sequence pattern generation device 1 according to the present embodiment configured as described above will be described with reference to FIG. 3. The sequence start process described below is started in a case where transmission start is selected for any one output of the outputs to be synchronized by the input to the operation unit 14.

In step S1, the device control unit 16 notifies the control units 29 and 39 of all the modules having the outputs to be synchronized of the delay amount set for all the outputs to be synchronized, and sets the delay amount. After the process of step S1 is executed, the device control unit 16 executes the process of step S2.

In step S2, the device control unit 16 determines whether or not the setting of the synchronization is inter-module synchronization.

In a case where it is determined to be the inter-module synchronization, the device control unit 16 executes a process of step S3. In a case where it is determined to be not the inter-module synchronization, the device control unit 16 executes the process of step S6.

In step S3, the device control unit 16 sets a state in which transmission start is selected for all the outputs to be synchronized. After the process of step S3 is executed, the device control unit 16 executes the process of step S4.

In step S4, the device control unit 16 causes the control units 29 and 39 to perform the control of the phase of the clock such that the clocks of all the modules having the outputs to be synchronized are matched. After the process of step S4 is executed, the device control unit 16 executes the process of step S5.

In step S5, the device control unit 16 waits for the locking of the phases of the clocks of the data generation units 26 and 36 of all the modules having the outputs to be synchronized. After the process of step S5 is executed, the device control unit 16 executes the process of step S6.

In step S6, the device control unit 16 resets the data generation units 26 and 36 by the control units 29 and 39 of all the modules having the outputs to be synchronized. After the process of step S6 is executed, the device control unit 16 executes the process of step S7.

In step S7, the device control unit 16 determines whether or not the resets of the data generation units 26 and 36 are completed.

In a case where it is determined that the resets of the data generation units 26 and 36 are completed, the device control unit 16 executes the process of step S8. In a case where it is determined that the resets of the data generation units 26 and 36 are not completed, the device control unit 16 executes the process of step S7.

In step S8, the device control unit 16 causes the control units 29 and 39 of all the modules having the outputs to be synchronized to release the reset states of the data generation units 26 and 36. After the process of step S8 is executed, the data generation units 26 and 36 execute the process of step S9.

In step S9, the data generation units 26 and 36 start the transmission of the sequence pattern with the set delay amount. After the process of step S9 is executed, the device control unit 16 ends the sequence start process.

The setting of the delay amount in step S1 can be changed at various timings, for example, during the transmission of the sequence in addition to when starting the sequence.

As described above, in the above-described embodiment, in a case where the outputs of the data signals are synchronized, the device control unit 16 sets the delay amount in the data generation units 26 and 36 by the control units 29 and 39 of all the modules having the outputs to be synchronized, aligns the phases of the clocks of all the modules having the outputs to be synchronized, locks the phases of the clocks of the data generation units 26 and 36, and starts the sequence with the set delay amount.

Accordingly, in a case where the outputs of the data signals are synchronized, the delay amount is set in the data generation units 26 and 36 by the control units 29 and 39 of all the modules having the outputs to be synchronized, the phases of the clocks of all the modules having the outputs to be synchronized are aligned, the phases of the clocks of the data generation units 26 and 36 are locked, and then the sequence is started with the set delay amount. Therefore, by controlling the transmission start timing of the sequence pattern of the plurality of outputs, the skew between the lanes of the plurality of lanes can be controlled.

In addition, the control units 29 and 39 control the delay amount by performing the control of the phase of the clock of the data generation units 26 and 36 for a portion of the delay amount equal to or less than ±500 mUI, and control the delay amount by shifting the output bit in units of 1 UI to the data generation units 26 and 36 for a portion of the delay amount greater than ±500 mUI.

As a result, the delay amount is controlled by performing the control of the phase of the clock of the data generation units 26 and 36 for a portion of the delay amount equal to or less than ±500 mUI, and the delay amount is controlled by shifting the output bit in units of 1 UI to the data generation units 26 and 36 for a portion of the delay amount greater than ±500 mUI. Therefore, the delay amount can be easily controlled.

In the present embodiment, the configuration has been described in which the measurement device 11 includes the operation unit 14, the display unit 15, and the device control unit 16, but a personal computer connected to the measurement device 11 may replace the functions of the operation unit 14, the display unit 15, and the device control unit 16.

Although an embodiment of the present invention has been disclosed, it will be apparent that modifications may be made by those skilled in the art without departing from the scope of the present invention. All such modifications and equivalents are intended to be included in the following claims.

DESCRIPTION OF REFERENCE NUMERALS
AND SIGNS

1: Sequence pattern generation device
2: Primary module
3: Secondary module
14: Operation unit
15: Display unit
16: Device control unit
26: Primary data generation unit
29: Primary control unit
36: Secondary data generation unit
39: Secondary control unit

What is claimed is:

1. A sequence pattern generation device, in which one or more modules each having one or more outputs of data signals are mountable and a total number of outputs of the data signals is equal to or greater than two, comprising:

a device control unit that, in a case where a start of a sequence of the outputs of the data signals is synchronized, sets delay amounts in data generation units by control units of all the modules each having an output to be synchronized, aligns phases of clocks of all the modules each having the output to be synchronized, and starts the sequence with the set delay amount after phases of clocks of the data generation units of the modules are locked.

2. The sequence pattern generation device according to claim 1, wherein the control unit controls the delay amount by performing control of the phase of the clock of the data generation unit for a portion of the delay amount equal to or less than ±500 mUI (Unit Interval), and controls the delay amount by shifting an output bit in units of 1 UI to the data generation unit for a portion of the delay amount greater than ±500 mUI.

3. A transmission start timing control method of a sequence pattern generation device, in which one or more modules each having one or more outputs of data signals are mountable and a total number of outputs of the data signals is equal to or greater than two, the transmission start timing control method comprising:

in a case where a start of a sequence of the outputs of the data signals is synchronized, setting delay amounts in data generation units of all the modules each having an output to be synchronized;

aligning phases of clocks of all the modules each having the output to be synchronized; and starting the sequence with the set delay amount after phases of clocks of the data generation units of the modules are locked.

4. The transmission start timing control method according to claim 3, wherein the delay amount is controlled by performing control of the phase of the clock of the data generation unit for a portion of the delay amount equal to or less than ±500 mUI (Unit Interval), and the delay amount is controlled by shifting an output bit in units of 1 UI to the data generation unit for a portion of the delay amount greater than ±500 mUI.

* * * * *